(12) United States Patent
Jo

(10) Patent No.: US 7,514,357 B2
(45) Date of Patent: Apr. 7, 2009

(54) METHOD OF MANUFACTURING A SEMICONDUCTOR DEVICE

(75) Inventor: Bo-Yeoun Jo, Gimpo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 165 days.

(21) Appl. No.: 11/293,693

(22) Filed: Dec. 2, 2005

(65) Prior Publication Data

US 2006/0141776 A1  Jun. 29, 2006

(30) Foreign Application Priority Data

Dec. 28, 2004 (KR) .................. 10-2004-0113659

(51) Int. Cl.
*H01L 21/44* (2006.01)
(52) U.S. Cl. .................. 438/638; 438/725; 438/745; 257/E21.226; 257/E21.256
(58) Field of Classification Search ............... 438/689, 438/700
See application file for complete search history.

(56) References Cited

U.S. PATENT DOCUMENTS

| | | | |
|---|---|---|---|
| 5,543,335 A * | 8/1996 | Zommer | 438/474 |
| 6,277,752 B1 * | 8/2001 | Chen | 438/692 |
| 6,727,185 B1 * | 4/2004 | Smith et al. | 438/727 |
| 6,777,344 B2 * | 8/2004 | Annapragada et al. | 438/725 |
| 6,833,081 B2 * | 12/2004 | Chen et al. | 216/100 |
| 6,884,728 B2 * | 4/2005 | Huang et al. | 438/700 |
| 6,924,221 B2 * | 8/2005 | Shen | 438/618 |
| 7,112,532 B2 * | 9/2006 | Ali et al. | 438/700 |
| 7,196,002 B2 * | 3/2007 | Su et al. | 438/618 |
| 7,199,059 B2 * | 4/2007 | Cheng et al. | 438/706 |
| 7,253,116 B2 * | 8/2007 | Fuller et al. | 438/710 |
| 2003/0203642 A1 * | 10/2003 | Smith et al. | 438/742 |
| 2004/0063306 A1 * | 4/2004 | Takeuchi | 438/622 |
| 2004/0157448 A1 * | 8/2004 | Yates et al. | 438/689 |
| 2005/0106888 A1 * | 5/2005 | Chiu et al. | 438/710 |

* cited by examiner

*Primary Examiner*—W. David Coleman
*Assistant Examiner*—Shaka Scarlett
(74) *Attorney, Agent, or Firm*—Andrew D. Fortney

(57) ABSTRACT

Electrical characteristics of a semiconductor device may be enhanced by completely removing a residue such as a polymer formed in a trench when the semiconductor device is manufactured by a method including: forming a via hole and a trench on a semiconductor substrate by an etching process; coating a photoresist on an entire surface of the semiconductor substrate such that the via hole and the trench may be filled thereby; removing a polymer defect in the trench while removing the coated photoresist by a plasma treatment under predetermined process conditions; and performing a wet cleaning process so as to remove a residue of the photoresist.

22 Claims, 3 Drawing Sheets

METHOD OF MANUFACTURING A SEMICONDUCTOR DEVICE

CROSS-REFERENCE TO RELATED APPLICATION

This application claims priority to and the benefit of Korean Patent Application No. 10-2004-0113659, filed in the Korean Intellectual Property Office on Dec. 28, 2004, the entire contents of which are incorporated herein by reference.

BACKGROUND OF THE INVENTION (a) Field of the Invention

The present invention relate to a method of manufacturing a semiconductor device. More particularly, the present invention relates to a method of manufacturing a semiconductor device that removes residues of polymer remaining in a trench for a metal line.

(b) Description of the Related Art

Typically, a semiconductor device has a plurality of layers sequentially formed on a substrate. In such a multi-layered structure, an interlayer insulation layer such as an oxide layer is required for insulation between layers, and a metal line may be formed in each layer.

Accordingly, metal lines (i.e., upper and lower metal lines) of adjacent metal layers having an interlayer insulation layer therebetween may be electrically connected with each other through a via hole formed through the interlayer insulation layer.

According to a conventional method, a lower metal line is firstly formed, and then a thick interlayer insulation layer is formed thereon. In addition, for an electrical connection between the lower metal line and an upper metal line that will be formed on the interlayer insulation layer, a photoresist pattern is formed on the interlayer insulation layer, for example, through a photomask process (application of a photoresist, exposure, development, etc.). Then, a via hole or a trench that selectively exposes an upper surface of the lower metal line may be formed by an etching process using the photoresist pattern.

For example, as shown in FIG. 1, a via hole 104 and a trench 106 are formed in a semiconductor substrate 102 (typically using separate photolithography steps for the trench and via). Here, the uppermost portion of the semiconductor substrate 102 includes the interlayer insulation layer (such as an oxide layer). When the via hole 104 and the trench 106 are formed, the photoresist pattern and residues of the etching process (for example, a carbon-based polymer) are removed through a dry ashing process (for example, an $O_2$ ashing process), a solvent cleaning process, etc.

When the oxide layer is etched using a photoresist pattern to form the trench 106, residues such as a polymer may remain in the trench 106. As a result, a crown defect 108 caused by the polymer may occur, as shown in FIG. 1. Such a polymer formed in the trench during the etching process of the oxide layer may not be fully removed easily by a dry ashing process or a solvent cleaning process, and it frequently remains in the trench.

However, a crown defect formed in the trench may be a cause of degradation of electrical characteristics of a metal material that will be filled in the via hole and the trench. In this case, the reliability and productivity of the semiconductor device may deteriorate.

The above information disclosed in this Background section is only for enhancement of understanding of the background of the invention, and therefore, it may contain information that does not form prior art or other knowledge that is already known in this or any other country to a person of ordinary skill in the art.

SUMMARY OF THE INVENTION

The present invention has been made in an effort to provide a method of manufacturing a semiconductor device having advantages of preventing degradation of electrical characteristics of a semiconductor device by fully removing a residue such as a polymer formed in a trench.

An exemplary method of manufacturing a semiconductor device according to an embodiment of the present invention includes: etching a via hole and a trench in a semiconductor substrate; coating a photoresist on the semiconductor substrate such that the via hole and the trench may be filled thereby; removing a polymer defect in the trench while removing the coated photoresist by a plasma treatment under predetermined process conditions; and performing a wet cleaning process so as to remove a residue of the photoresist.

The removal of the polymer defect in the trench may include: patterning the photoresist by partially removing the photoresist above the trench; exposing a bottom side of the trench by etching the photoresist; removing the polymer defect in the trench by plasma etching in a first atmosphere under first predetermined process conditions; and removing the photoresist remaining on the semiconductor substrate by plasma etching in a second atmosphere under second predetermined process conditions.

A critical dimension of the patterned portion of the photoresist may be less than a critical dimension of the trench. For example, the critical dimension of the patterned portion of the photoresist may be less than the critical dimension of the trench by at least 15 to 25%.

The bottom side of the trench may be exposed by etching the photoresist in an $O_2$ gas atmosphere under a first power condition of 0 W and then under a second power condition of a few hundred to a few thousand W (e.g., 200 to 5000 W). Exposing the bottom side of the trench may comprise a temperature condition of 200 to 250° C.

The first plasma etching atmosphere may comprise a $CF_4$ and Ar atmosphere. The first plasma etching conditions may comprise a power condition of at least 1000 W.

The $CF_4$ and Ar gas volumes may be set at a ratio of about 1:10.

The second plasma etching atmosphere may comprise a first $O_2$ plasma atmosphere then an $O_3$ plasma atmosphere. The $O_2$ plasma etching conditions may comprise sequential plasma etching conditions of about 1 Torr pressure/about 1700 W power/a flow rate of about 2000 sccm $O_2$/a temperature of about 250° C., about 1 Torr pressure/about 1700 W power/a flow rate of about 2000 sccm $O_2$/a temperature of about 250° C., and about 1 Torr pressure/about 1700 W power/a flow rate of about 2000 sccm $O_2$/a temperature of about 250° C.

The $O_3$ plasma etching conditions may comprise sequential plasma etching conditions of about 2 Torr pressure/about 0 W power/a flow rate of about 2000 sccm $O_3$/a temperature of about 250° C., about 2 Torr pressure/about 2000 W power/a flow rate of about 2000 sccm $O_3$/a temperature of about 250°

C., and about 500 Torr pressure/about 2500 W power/a flow rate of about 2000 sccm $O_3$/a temperature of about 250° C.

DETAILED DESCRIPTION OF THE EMBODIMENTS

An exemplary embodiment of the present invention will hereinafter be described in detail with reference to the accompanying drawings.

According to an exemplary embodiment of the present invention, after a via hole and a trench are formed on or in a semiconductor substrate, a photoresist is formed entirely (e.g., blanket deposited) thereon, and then the photoresist is partially removed (e.g., by photolithography and development). Accordingly, a polymer residue (for example, a crown defect) may be exposed. After the exposed polymer residue is removed, the photoresist remaining in the via hole and the trench is removed by a plasma treatment. As a result, the trench may be free from a polymer residue.

FIG. 2A to FIG. 2E are cross-sectional views showing sequential stages of forming a trench on a semiconductor substrate by an etching process according to an exemplary embodiment of the present invention.

Figure 1:
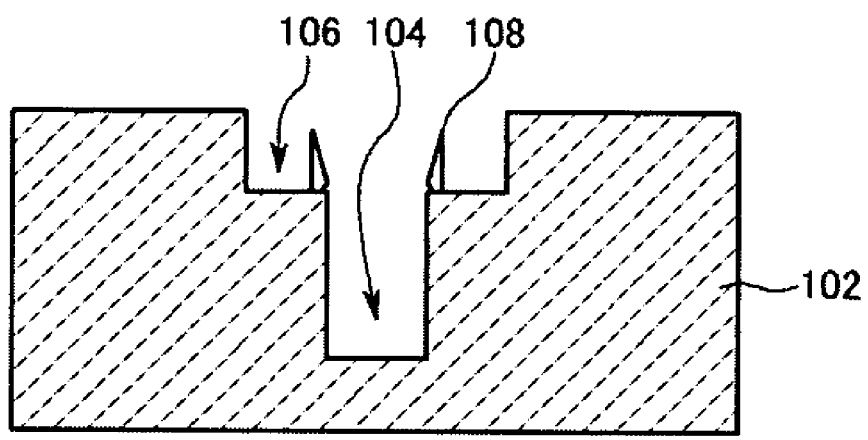
FIG. 1 is a cross-sectional view showing a crown defect as an exemplary defect formed in a trench that is formed on a semiconductor substrate according to a conventional etching process.
Figure 2A:
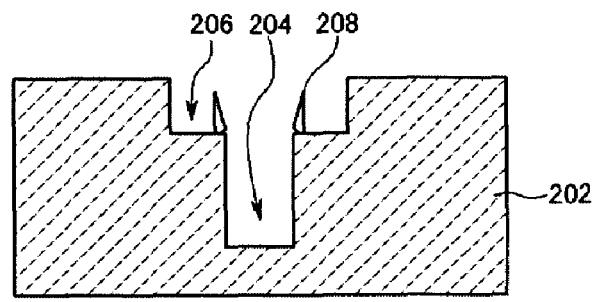
FIG. 2A to FIG. 2E are cross-sectional views showing sequential stages of forming a trench in a semiconductor substrate by an etching process according to an exemplary embodiment of the present invention.

Referring to FIG. 2A, a photoresist pattern is formed on a semiconductor substrate 202 having one or more interlayer insulation layers (for example, an oxide layer such as silicon dioxide, a boron- and/or phosphorous-doped silicon dioxide, or a fluorosilicate glass [FSG] having one or more undoped silicate glass [USG] and/or silicon nitride layers thereon, thereunder or interposed therethrough) by a photomask process (application of a photoresist, an exposure, development, etc.). Then, a via hole 204 that selectively exposes an upper surface of the lower metal line (not shown) may be formed by an etching process using the photoresist pattern, followed by forming a trench 206 by etching the interlayer insulation layer(s) 202 using a second photoresist pattern, similarly to formation of via hole 204, or vice versa. At this time, a residue such as a polymer produced during etching of the semiconductor substrate 202 may be formed in the trench 206, and a crown defect 208 (e.g., comprising the polymer) may be formed as shown in FIG. 2A. However, the crown defect 208 of the polymer is not generally removed by ashing and solvent cleaning processes, and it usually remains in the trench 206 after such processes.

Therefore, according to an exemplary embodiment of the present invention, a photoresist is again coated on the substrate after forming the trench 206 (and via 204) in order to remove the crown defect 208 of the polymer. Subsequently, the crown defect is exteriorly exposed by ashing the photoresist. Then, the crown defect is removed by another ashing process under predetermined ashing conditions, and the photoresist remaining in the via hole is removed. Finally, a solvent cleaning process (i.e., a wet cleaning process) may be performed.

Figure 2B:
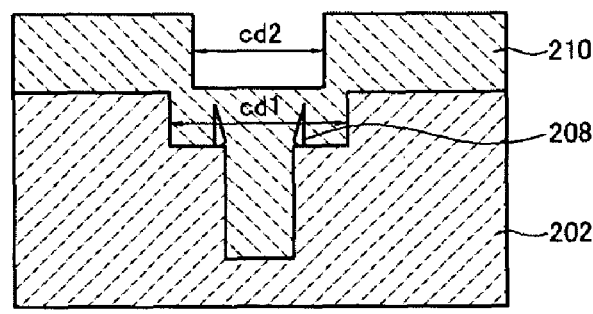

In more detail, according to an exemplary embodiment of the present invention, ashing and solvent cleaning processes are not immediately performed after forming the via hole 204 and the trench 206 in the semiconductor substrate 202. That is, as shown in FIG. 2B, a photoresist layer 210 is formed on an entire surface of the semiconductor substrate 202, for example, by a blanket deposition technique such as spin coating, such that the crown defect 208 may be fully covered by the photoresist 210. The photoresist layer 210 may be relatively thick (e.g., about or slightly greater than a conventional photoresist thickness). Subsequently, the photoresist 210 is partially removed by patterning the photoresist 210 (e.g., by selective exposure and development) as shown in FIG. 2B.

Here, the patterned portion of the photoresist 210 has a critical dimension cd2 that is smaller than a critical dimension cd1 of the trench, for example, by about 15 to 25%. Preferably, the patterned portion of the photoresist 210 has a critical dimension cd2 that is greater than a width of the via 204 (for example, by at least about 15 to 25%). By such a structure, sidewalls of the trench 206 may be protected from etching for removing the crown defect 208 through a subsequent ashing process. For example, when the critical dimension cd1 of the trench 206 is 0.15 µm, the critical dimension cd2 of the patterned portion of the photoresist 210 may be about 0.12 µm.

Figure 2C:
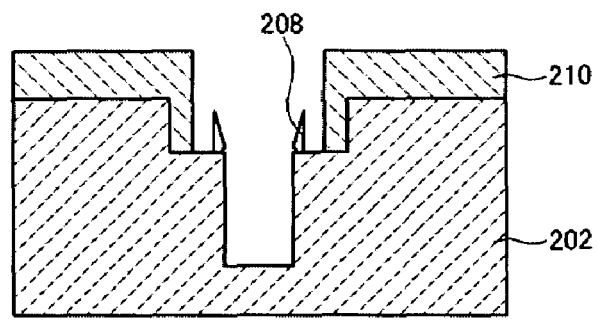

Subsequently, the crown defect 208 (e.g., comprising a polymer formed during initial trench and via etching) is fully exposed as shown in FIG. 2C, by etching the photoresist 210 on an entire surface thereof (e.g., anisotropic etching) through an ashing process including two ashing steps in an $O_2$ gas atmosphere under the following process conditions. That is, a bottom surface of the trench 206 is generally fully exposed after an ashing process comprising the following two steps:

Step 1: 1 Torr/0 W/2500 sccm $O_2$/30 seconds/220° C.
Step 2: 1 Torr/1500 W/2500 sccm $O_2$/30 seconds/220° C.

That is, the ashing process is preferably performed under a power condition (e.g., an RF source power) of about 0 W at step 1, and under a power condition (e.g., the RF source power) of about 1500 W at step 2. In addition, in order to prevent hardening of the photoresist 210, the ashing process is preferably performed under a temperature condition of about 220° C. (in a range of about 200 to 250° C.). In addition, the power condition at step 2 may be set to be a few hundred to a few thousand W (e.g., from 200 to 5000 W), depending on the type of the photoresist 210 and/or its thickness.

Figure 2D:
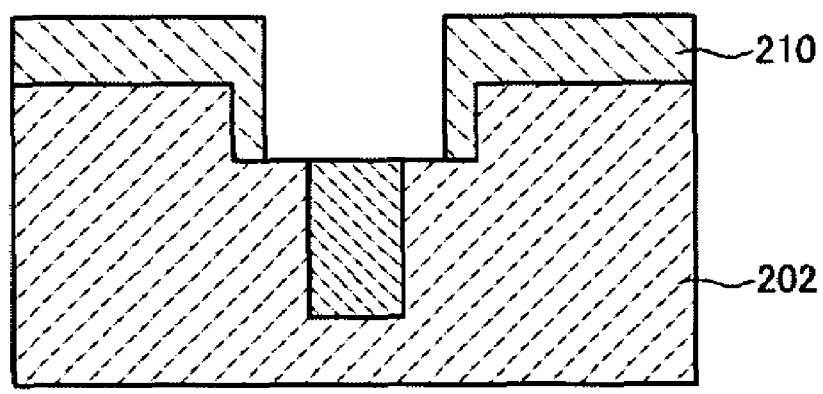

When the crown defect 208 is fully exposed after etching the photoresist 210 through the ashing process under the above-described process conditions, an etching process in a first plasma atmosphere under the following process conditions may be performed such that the exposed crown defect 208 can be fully removed as shown in FIG. 2D.

Crown Defect Removal Step: 40 mTorr/1500 W (source)/1500 W (bias)/80 sccm $CF_4$/800 sccm Ar/30 seconds Although source and bias powers are set to be 1500 W at the above step, the present invention is not necessarily limited thereto. The values of the source and bias powers are set so that etching reactivity is stronger at a bottom side than at a lateral side of the trench 206, and for this purpose, the source and bias powers may both be above 1000 W, with generally about the same values for the other process conditions. In addition, the volume of the $CF_4$ gas and the Ar gas may be set at a ratio of about 1:10, although a ratio of from about 1:5 to about 1:20 may be suitable. Similarly, the total flow rate of the fluorocarbon (e.g., $CF_4$) and inert (e.g., Ar) gases may be from 300 to 1500 sccm, and the etching chamber pressure may be from 3 to 100 mTorr (preferably from 20 to 60 mTorr).

When the crown defect 208 formed in the trench 206 is substantially fully removed, an etching process in a second plasma atmosphere having the following process conditions (step 1 to step 6) may be performed to substantially remove the photoresist 210 remaining on top of the semiconductor substrate 202 and in the via hole 204:

Step 1: 1 Torr/1700 W/1000 sccm $O_2$/15 seconds/250° C.
Step 2: 1 Torr/1700 W/2000 sccm $O_2$/30 seconds/250° C.
Step 3: 1 Torr/1700 W/1000 sccm $O_2$/15 seconds/250° C.
Step 4: 2 Torr/0 W/2000 sccm $O_3$/20 seconds/250° C.
Step 5: 2 Torr/2000 W/2000 sccm $O_3$/30 seconds/250° C.
Step 6: 500 Torr/2500 W/2000 sccm $O_3$/30 seconds/250° C.

The etching process in the second plasma atmosphere is realized by consecutively performing $O_2$ plasma atmosphere etching, then $O_3$ plasma atmosphere etching. In addition, the $O_2$ plasma atmosphere etching may be performed using the above steps 1 to 3, and the $O_3$ plasma atmosphere etching may be performed using steps 4 to 6.

Throughout the above steps 1 to 6, only single values are shown for respective process conditions. However, it should be understood that the present invention is not necessarily limited thereto, and each process condition may be varied as follows. That is, the pressure may remain at substantially the same level throughout steps 1 to 3 (although the actual value may vary from about 0.5 mTorr to about 5 mTorr). The flow rate of $O_2$ gas used at step 1 is less than that at step 2, so that step 1 may have a smaller ashing rate. For the same reason, a relatively small amount of $O_2$ gas is used at step 3 (although the actual values may vary from 100 to 4000 sccm). The power remains at about the same level throughout steps 1 to 3 (although the actual value may vary from about 1000 to about 2500 W). In addition, the process time of step 1 may be about 10-20 seconds. The process time of step 2 is set to be a time to reach an end point (e.g., as determined by conventional end point detection, or EPD), and the process time of step 3 may be about the same as that of the first or fifth steps (preferably the same as the first step).

In addition, at step 4 and step 5, the $O_3$ gas may be used at a relatively higher pressure that that of $O_2$ gas in steps 1 to 3 (e.g., from about 1 mTorr to about 10 mTorr for steps 4-5, and from about 100 mTorr to about 1500 mTorr for step 6). At step 4, the power is turned off. In addition, the pressure at step 6 is relatively high. A relatively high power is used at step 6, considering the possibility of remaining photoresist residue.

Therefore, according to an exemplary embodiment of the present invention, the photoresist pattern 210 remaining on the semiconductor substrate 202 may be fully removed by performing an ashing process comprising the above-described plasma treatment (e.g., step 1 to step 6) under the above-described series of process conditions.

Figure 2E:
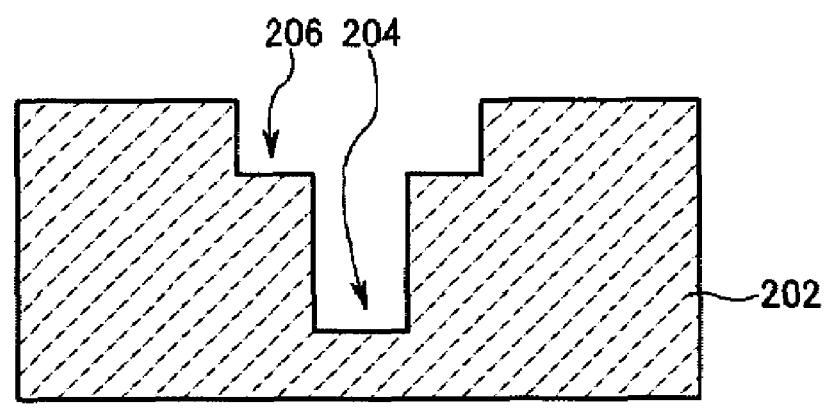

Finally, the photoresist residue may be washed off by a wet cleaning process such as a solvent cleaning, and accordingly, as shown in FIG. 2E, a trench 206 may be completed at a target position of the semiconductor substrate 202 without leaving a defect of a polymer such as a crown defect of the polymer.

In the above description, specific values of the process conditions for the post-treatment performed according to the present exemplary embodiment after forming the via hole and the trench in the semiconductor substrate are given. However, the present invention is not necessarily limited thereto, and the process conditions may be varied depending on specific situations.

In the above exemplary embodiment of the present invention, for better comprehension and convenience of description, the photoresist pattern has been described to be formed directly on the semiconductor substrate. However, the present invention is not necessarily limited thereto, and the photoresist pattern may be formed after a pad oxide layer (or a buffer oxide layer or antireflective coating) is formed on the semiconductor substrate. In such a varied scheme, substantially the same result may be obtained when the post-treatment process (that is, removing a polymer defect formed in the trench) is performed after the formation of the trench.

As described above, according to an exemplary embodiment of the present invention, a photoresist is coated (e.g., blanket deposited) on an entire surface of a semiconductor substrate after forming a via hole and a trench therein. After exposing a polymer residue by partially removing the photoresist, the exposed polymer residue is removed. Subsequently, the polymer residue is fully removed by a post-treatment process in which the photoresist remaining in the via hole and the trench is removed by a plasma treatment. Consequently, degradation of electric characteristics and deterioration of reliability of a semiconductor device may be effectively reduced or prevented even if a polymer is formed in a trench during an etching process for forming the trench.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device, comprising:
    forming a via hole and a trench on a semiconductor substrate by an etching process;
    coating a photoresist on an entire surface of the semiconductor substrate to fill the via hole and the trench;
    patterning the photoresist by partially removing the photoresist above the trench;
    exposing a bottom side of the trench by etching the photoresist in an atmosphere containing oxygen ($O_2$) gas using a first power condition of 0 watts (W) and a second power condition ranging from 1000 W to 3000 W;
    removing a polymer defect in the trench by performing an etching process in a first plasma atmosphere under first process conditions;
    removing the photoresist remaining on the semiconductor substrate by consecutively etching in an $O_2$ plasma atmosphere under $O_2$ plasma process conditions including a substantially constant $O_2$ plasma etching pressure and then in an ozone ($O_3$) plasma atmosphere under $O_3$ plasma predetermined process conditions including an $O_3$ plasma etching pressure higher than the substantially constant $O_2$ plasma etching pressure, wherein the $O_2$ plasma process conditions further comprise sequentially a first flow rate of $O_2$ gas, then a second flow rate of $O_2$ gas greater than the first flow rate of $O_2$ gas, then a third flow rate of $O_2$ gas lower than the second flow rate of $O_2$ gas; and
    performing a wet cleaning process so as to remove a residue of the photoresist.

2. The method of claim 1, wherein a critical dimension of the patterned portion of the photoresist is less than a critical dimension of the trench.

3. The method of claim 2, wherein the critical dimension of the patterned portion of the photoresist is less than the critical dimension of the trench by at least 15 to 25%.

4. The method of claim 1, wherein exposing the bottom side of the trench is performed at a temperature of 200 to 250° C.

5. The method of claim 1, wherein the first plasma atmosphere comprises tetrafluoromethane ($CF_4$) and argon (Ar).

6. The method of claim 5, wherein etching in the first plasma atmosphere further comprises a power condition of at least 1000 W.

7. The method of claim 5, wherein a volume ratio of the $CF_4$ and Ar gas is about 1:10.

8. The method of claim 1, wherein etching in the $O_2$ plasma atmosphere comprises sequential plasma etching conditions of:

1 Torr/1700 W/1000 sccm $O_2$/250° C.;

1 Torr/1700 W/2000 sccm $O_2$/250° C.; and

1 Torr/1700 W/1000 sccm $O_2$/250° C.

9. The method of claim 1, wherein etching in the $O_3$ plasma atmosphere comprises sequential plasma etching conditions of:

2 Torr/0 W/2000 sccm $O_3$/250° C.;

2 Torr/2000 W/2000 sccm $O_3$/250° C.; and

500 Torr/2500 W/2000 sccm $O_3$/250° C.

10. The method of claim 1, wherein:

exposing the bottom side of the trench comprises a temperature condition of 200 to 250° C.;

etching conditions in the first plasma atmosphere comprises a power of at least 1000 W, and a volume ratio of $CF_4$ and Ar gas of about 1:10;

etching in the $O_2$ plasma atmosphere comprises sequential plasma etching conditions comprising 1 Torr/1700 W/1000 sccm $O_2$/250° C., 1 Torr/1700 W/2000 sccm $O_2$/250° C., and 1 Torr/1700 W/1000 sccm $O_2$/250° C.; and etching in the $O_3$ plasma atmosphere comprises sequential plasma etching conditions comprising 2 Torr/0 W/2000 sccm $O_2$/250° C., 2 Torr/2000 W/2000 sccm $O_3$/250° C., and 500 Torr/2500 W/2000 sccm $O_3$/250° C.

11. A method of manufacturing a semiconductor device, comprising:

forming a via hole and a trench on a semiconductor substrate by an etching process;

coating a photoresist on an entire surface of the semiconductor substrate to fill the via hole and the trench;

removing a polymer defect in the trench by performing an etching process in a first plasma atmosphere, wherein the first plasma atmosphere under first process conditions;

removing the photoresist remaining on the semiconductor substrate by consecutively plasma etching in an $O_2$ plasma atmosphere under $O_2$ plasma process conditions including a substantially constant $O_2$ plasma etching pressure and then plasma etching in an ozone ($O_3$) plasma atmosphere under $O_3$ plasma process conditions including an $O_3$ plasma etching pressure higher than the substantially constant $O_2$ plasma etching pressure, wherein the $O_2$ plasma process conditions comprise sequentially a first flow rate of $O_2$ gas, then a second flow rate of $O_2$ gas greater than the first flow rate of $O_2$ gas, then a third flow rate of $O_2$ gas lower than the second flow rate of $O_2$ gas; and performing a wet cleaning process so as to remove a residue of the photoresist.

12. The method of claim 11, wherein a critical dimension of the patterned portion of the photoresist is less than a critical dimension of the trench by at least 15 to 25%.

13. The method of claim 11, wherein exposing the bottom side of the trench is performed at a temperature of 200 to 250° C.

14. The method of claim 11, wherein the first plasma atmosphere comprises $CF_4$ and Ar.

15. The method of claim 14, wherein a volume ratio of the $CF_4$ to Ar is about 1:10.

16. The method of claim 11, wherein removing the polymer defect in the trench comprises:

patterning the photoresist by partially removing the photoresist above the trench;

exposing a bottom side of the trench by etching the photoresist;

removing the polymer defect in the trench by etching in the first plasma atmosphere at a power of at least 1000 W; and removing the photoresist remaining on the semiconductor substrate by etching in a second plasma atmosphere under process conditions.

17. The method of claim 16, wherein exposing a bottom side of the trench by etching the photoresist in an atmosphere containing $O_2$ gas using a first power condition of 0 W and a second power condition ranging from 1000 W to 3000 W.

18. The method of claim 8, wherein etching in the $O_3$ plasma atmosphere comprises sequential plasma etching conditions of:

2 Torr/0 W/2000 sccm $O_3$/250° C.;

2 Torr/2000 W/2000 sccm $O_3$/250° C.; and

500 Torr/2500 W/2000 sccm $O_3$/250° C.

19. The method of claim 1, wherein the third flow rate of $O_2$ gas is substantially equal to the first flow rate of $O_2$ gas.

20. The method of claim 11, wherein the third flow rate of $O_2$ gas is substantially equal to the first flow rate of $O_2$ gas.

21. The method of claim 1, wherein the first process conditions further comprise plasma etching at the first flow rate of $O_2$ gas for about 10-20 seconds, plasma etching at the second flow rate of $O_2$ gas until an end point is reached, and plasma etching at the third flow rate of $O_2$ gas for about 10-20 seconds.

22. The method of claim 11, wherein the first process conditions further comprise plasma etching at the first flow rate of $O_2$ gas for about 10-20 seconds, plasma etching at the second flow rate of $O_2$ gas until an end point is reached, and plasma etching at the third flow rate of $O_2$ gas for about 10-20 seconds.

* * * * *